United States Patent [19]

King et al.

[11] 4,132,624

[45] Jan. 2, 1979

[54] APPARATUS FOR PRODUCING METAL OXIDE FILMS

[75] Inventors: Robert D. King, Solihull; Robert Hiscutt, Birmingham, both of England

[73] Assignee: Triplex Safety Glass Company Limited, London, England

[21] Appl. No.: 785,106

[22] Filed: Apr. 6, 1977

Related U.S. Application Data

[60] Continuation of Ser. No. 472,325, May 22, 1974, abandoned, which is a division of Ser. No. 220,899, Jan. 26, 1972, Pat. No. 4,006,070.

[30] Foreign Application Priority Data

Feb. 5, 1971 [GB] United Kingdom ................. 4234/71

[51] Int. Cl.² ........................................... C23C 15/00
[52] U.S. Cl. ................................................ 204/298
[58] Field of Search ............................... 204/192, 298

[56] References Cited

U.S. PATENT DOCUMENTS

| 3,369,989 | 2/1968 | Kay et al. | 204/298 |
| 3,414,503 | 12/1968 | Buchard | 204/298 |
| 3,907,660 | 9/1975 | Gillery | 204/298 |

FOREIGN PATENT DOCUMENTS

1147318 4/1969 United Kingdom ..................... 204/298

Primary Examiner—J. H. Mack
Assistant Examiner—Aaron Weisstuch
Attorney, Agent, or Firm—Burns, Doane, Swecker & Mathis

[57] ABSTRACT

A substantially uniform, transparent, electrically conducting, metal oxide film (e.g. of indium/tin oxide) can be deposited on to a substrate such as glass of large lateral dimensions, e.g. a windscreen for an aircraft or a land vehicle, by low-pressure reactive sputtering from a cathode of the metal, using an atmosphere of oxygen and another gas or gases (preferably an inert gas) at reduced pressure, by providing access for the sputtering atmosphere to penetrate into the whole of the working space between the cathode and the substrate so as to maintain a substantial degree of uniformity in the oxygen concentration in the working space. Access for the atmosphere may be provided by means of passages extending through the cathode assembly, by dividing the cathode assembly into parallel strips separated by gaps, and the atmosphere may be supplied direct to the working space through such gaps. Relative movement is effected between the cathode assembly and the substrate, e.g. by reciprocating the parallel strips of the divided cathode in the direction perpendicular to their length.

24 Claims, 11 Drawing Figures

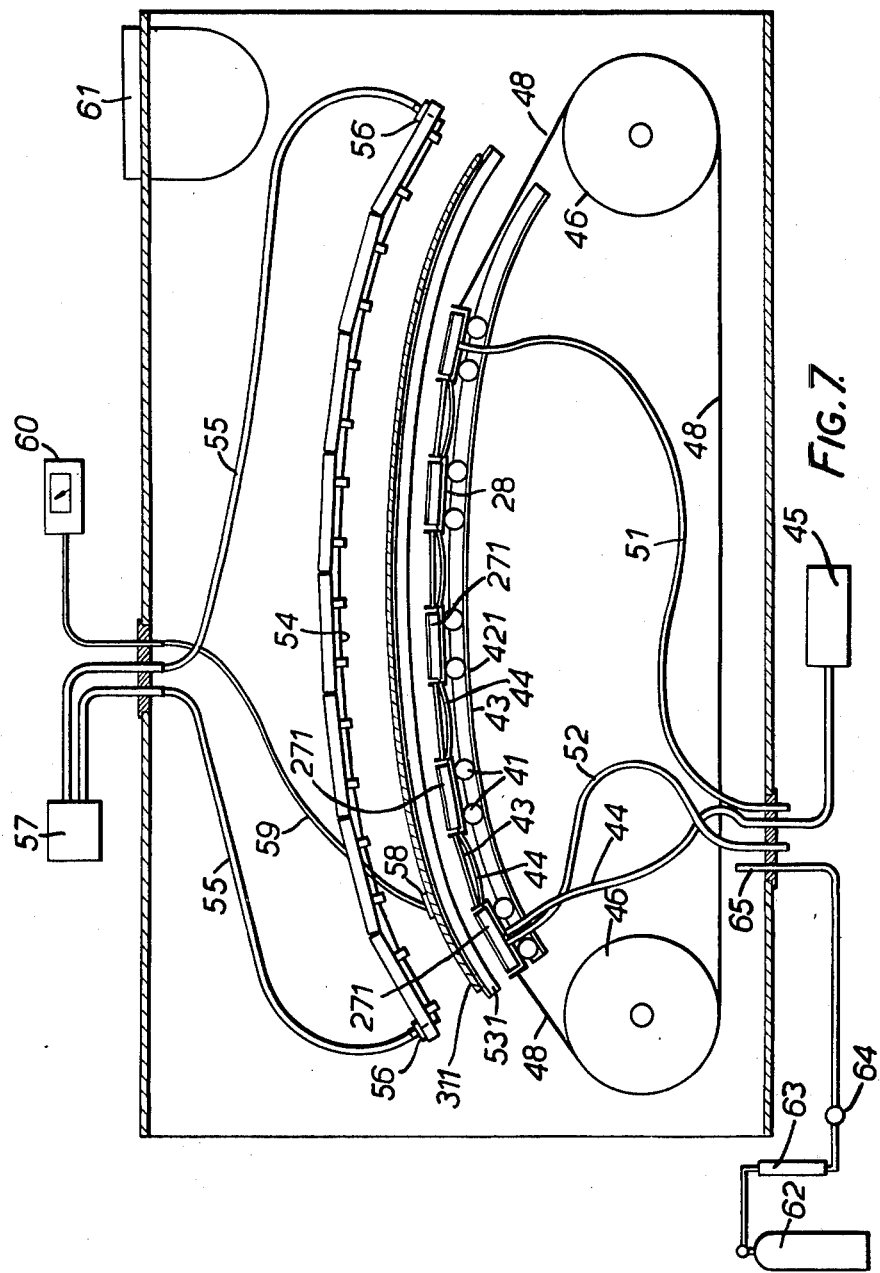

APPARATUS FOR PRODUCING METAL OXIDE FILMS

This is a continuation of application Ser. No. 472,325, filed May 22, 1974, now abandoned which is a division of application Ser. No. 220,899, filed on Jan. 26, 1972, now U.S. Pat. No. 4,006,070, issued Feb. 1, 1977.

BACKGROUND OF THE INVENTION

Cross-Reference to Related Application

The invention is related to that described in co-pending application Ser. No. 144,541 filed May 18, 1971, now U.S. Pat. No. 4,065,600.

Field of the Invention

This invention relates to methods and apparatus for depositing transparent, electrically conducting, metal oxide films on to substrates, such as glass, and to articles having such metal oxide films applied thereto. By way of example, the article may be a windscreen, e.g. an aircraft windscreen, on which the film can provide electrical resistance heating means for de-icing or de-misting.

Description of Prior Art

Various proposals have been made for reactively sputtering a transparent, electrically conducting, metal oxide film on to the surface of a substrate supported in a vacuum vessel having an atmosphere of oxygen and another gas or gases, from a metal cathode near the substrate surface to be coated. One example of such a process is described in U.S. patent application Ser. No. 144,541 now U.S. Pat. No. 4,065,600.

Such processes have been successful in producing transparent, electrically conducting, films of reasonably uniform characteristics on substrates of relatively small lateral dimensions, e.g. 4 cm. in width, but difficulties have been experienced with large articles. Even though the cathode is enlarged commensurately with the article, so as to cover the whole substrate area and to maintain the direct sputtering path from cathode to substrate at the optimum value (between 2 cm. and 10 cm. depending on the applied potential difference), it is found that the film produced tends to be non-uniform. Variations are found in the thickness and specific electrical resistivity of the film, which result in wide variations in its resistance and diminish or destory its utility as a resistance heating means. In extreme cases, the film is also found to be less transparent near the middle of the article. Any such reduction in transparency is unacceptable in a windscreen, for example.

The present inventors have deduced that the non-uniformity of the film is due to a reduction in the oxygen concentration in the atmosphere in the working space between the cathode and the substrate, which is believed to be caused by the consumption of the oxygen originally present during the formation of the film, and by the slow rate at which fresh oxygen can diffuse into this space. As the process proceeds, a gradient of oxygen concentration is thus established in the atmosphere in the working space in a plane parallel to the cathode surface, the concentration falling towards the center of the cathode.

For economy in production, it is desirable to have a high deposition rate and to achieve a minimum specific resistivity ($\rho$). However, as the rate of deposition is increased, the rate of consumption of oxygen is also increased and the effect to the gradient in the oxygen concentration will become more severe. Further, as the area of the substrate and cathode is increased so the gradient of oxygen concentration is established over greater distances, the oxygen starvation at the centre of the substrate becomes more pronounced. Consequently it is no longer possible to maintain the desired oxygen concentration necessary to provide a minimum specific electrical resistivity and adequate transparency over the whole area of the substrate to be coated.

The existence of the above-mentioned oxygen gradient has been found to be most detrimental to the deposition of a uniform film. The effect can generally be detected where each lateral dimension, i.e. length and width, of the substrate is substantially greater than the distance between the cathode and substrate, e.g. is greater than 10 cm., and particularly if they are greater than 30 cm.

OBJECT OF THE INVENTION

An object of this invention is to provide an improved method and apparatus for depositing film on larger substrates than hitherto practicable, e.g. substrates having both lateral dimensions greater than 30 cm., and in particular on substrate such as windscreens for aircraft and land vehicles, whose dimension can each 100 cm. and more.

SUMMARY OF THE INVENTION

According to the invention, we provide a method of depositing a transparent, electrically conducting metal oxide film by reactive sputtering on to the surface of a substrate of extended lateral dimensions which is maintained at a controlled elevated temperature in a vacuum chamber containing an atmosphere of oxygen and another gas or gases at a controlled reduced pressure, a high negative potential being applied to a cathode assembly of the metal which is arranged in the vicinity of the substrate and presents a surface or surfaces extending substantially parallel to the substrate surface so that sputtering takes place substantially perpendicularly on to all parts of the substrate, wherein access is provided for the atmosphere to penetrate into the whole of the working space between the cathode assembly and the substrate so as to maintain a substantial degree of uniformity in the oxygen concentration in the working space.

The term "extended lateral dimensions" is to be understood to mean having lateral dimensions substantially greater than the distance between the cathode and substrate, and generally having its smallest lateral dimension greater than 30 cm.

Variation in the oxygen concentration has been found to affect the specific electrical resistivity ($\rho$) and the thickness (t) deposited in a given time and hence the resistance in ohm/square of the sputtered film, as disclosed in the Specification of co-pending U.S. patent application No. 144,541, now U.S. Pat. No. 4,065,600. It will be understood that the resistance in ohm/square is independent of the size of the square under consideration and is related to the specific resistivity and thickness by the equation $R\square = \rho/t$. By providing access for the atmosphere into the whole of the working space so as to maintain the oxygen concentration substantially uniform, we have found it possible to produce articles of considerable size coated with films having substantially uniform low resistance in ohm/square and substantially uniform high light transmission.

In one form of the invention, passages extend through the cathode assembly to provide the access for the atmosphere into the working space. Preferably relative movement is provided between the cathode assembly and the substrate in a direction parallel to the substrate surface. In a preferred embodiment of the invention, the cathode assembly is divided into spaced parallel strips so as to provide the passages for the atmosphere between the strips, and the relative movement is provided between the strips and the substrate in a direction transverse to the length of the strips so that the strips cover all parts of the substrate surface for equal deposition periods during one part or another of the deposition process. Preferably the relative movement between the strips and the substrate is a reciprocating movement. Advantageously the relative movement is substantially equal to the spacing between the centre lines of adjacent strips. The strips may move on guide rails relative to the substrate.

The invention also provides an article of extended lateral dimensions having a transparent electrically conducting film deposited on a surface thereof by a method as described above, said film having a specific electrical resistivity between $2 \times 10^{-4}$ ohm. cm. and $20 \times 10^{-4}$ ohm. cm. and preferably between $2 \times 10^{-4}$ ohm. cm. and $4 \times 10^{-4}$ ohm. cm., a thickness of between 500 Å and 10,000 Å, and a light transmission figure of over 70%. Where the film thickness is below 5000 Å, the light transmission figure may be over 80%.

The invention further provides a glass article of extended lateral dimensions having a transparent electrically conducting film of indium/tin oxide deposited on a surface thereof, said film having a substantially uniform resistance of between 2 and 40 ohm/square and a light transmission figure of over 80%.

The invention further provides apparatus for depositing a transparent, electrically conducting metal oxide film by reactive sputtering on to the surface of a substrate of extended lateral dimensions, comprising a vacuum chamber, means for supporting the substrate in the vacuum chamber, means for maintaining the substrate at a controlled elevated temperature in the vacuum chamber, means for supplying an atmosphere of oxygen and another gas or gases at reduced pressure into the vacuum chamber, a cathode assembly arranged in the vacuum chamber in the vicinity of the substrate and presenting a surface or surfaces capable of extending over the whole of the substrate surface and substantially parallel thereto, and means for applying a high negative potential to the cathode assembly, wherein means is provided for allowing access for the atmosphere to penetrate into the whole of the working space between the cathode assembly and the substrate so as to maintain a substantial degree of uniformity in the oxygen concentration in the working space.

BRIEF DESCRIPTION OF THE DRAWINGS

In the accompanying drawings:

FIG. 7 is a longitudinal axial section through the apparatus of FIG. 6, modified to deposit a film on a substrate which is curved from end to end;

DETAILED DESCRIPTION

Figure 1:
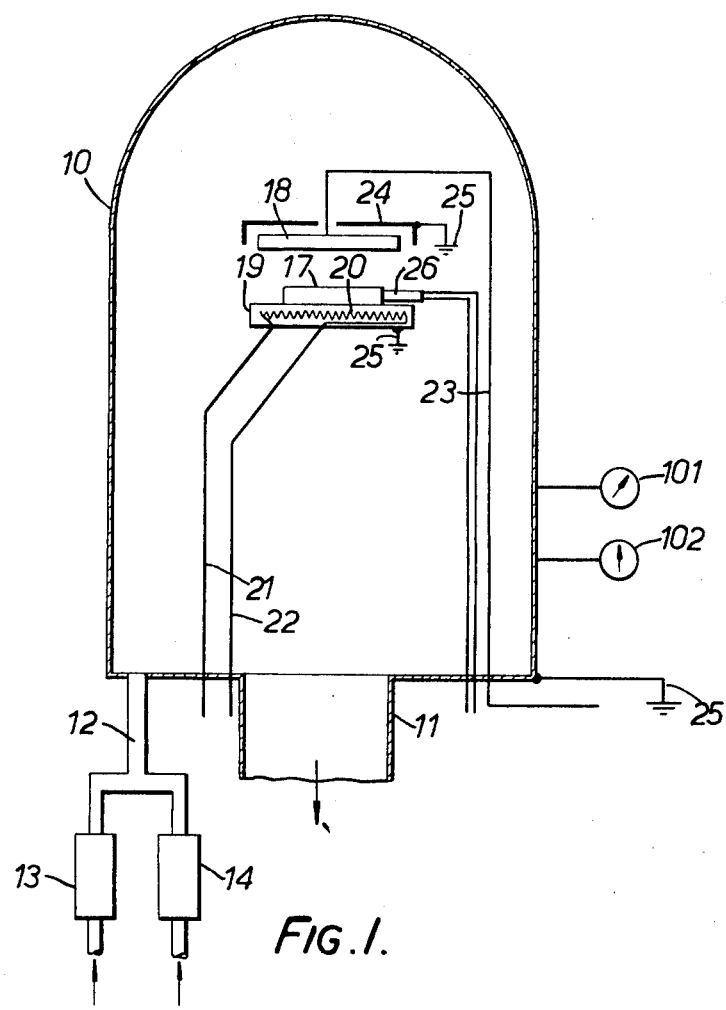
FIG. 1 is a diagrammatic layout of a known type of apparatus for reactively sputtering a film on a relatively small substrate surface.

Referring to FIG. 1, there is shown a vacuum vessel 10 for connection by conduit 11 to a vacuum pump (not shown). A further conduit 12 passing through the wall of the vacuum vessel 10 is connected via gas flow meters 13, 14 to separate sources of oxygen and argon respectively. These gas flow meters 13, 14 are provided to ensure accurate control of the rate of flow of the oxygen into the argon and thence into the atmosphere of the vacuum vessel 10.

Within the vacuum vessel 10 there is mounted a substrate 17 which is to be coated with an electrically conductive film by sputtering from a water cooled cathode 18. The substrate 17 is supported on a heated block 19 which is heated by an internal electric heating element 20 connected by leads 21, 22 to an external source of low voltage electrical power. The cathode 18 is connected by a lead 23 to the negative terminal of an external source of high voltage. An earthed electrostatic screen 24 is provided round the cathode 18, and the heated block 19 and vacuum vessel 10 are also earthed as indicated at 25. Instead of the heated block 19 being heated internally, the heating element 20 may be disposed on insulated support pillars on the upper surface of the block 19 so that the substrate is heated mainly by radiation.

In order to determine and to control the temperature of the substrate 17 at the required value, a thermocouple 26 is attached to the edge of the substrate 17 so as to be in thermal contact with it. The thermocouple provides a measure of the surface temperature of the substrate 17, as it is heated by the heated block 19. As the substrate 17 is exposed to the plasma induced by the electric field existing between the cathode and the substrate 17, the additional power injected by the plasma heats the substrate, and it is consequently necessary to gradually reduce the electric power supplied to the heating element 20 inside the block 19, in order to maintain the temperature of the substrate at the required value.

The substrate 17, which may be of toughened soda-lime-silica glass, is placed on the heated block 19 in the vaccum vessel 10. The vacuum vessel 10 is then evacuated to a pressure of say $5 \times 10^{-4}$ mm Hg as measured on a Penning vacuum pressure gauge 101, and low voltage (say 10 volts) electric power applied to heating element 20 through leads 21, 22. The substrate surface is thereby heated to a selected temperature between 240° C. and 400° C. Oxygen gas is then admitted to the vacuum vessel 10 through the gas flow meter 13 and argon gas through the gas flow meter 14 at desired flow rates. This flow of gas results in the presence of a selected percentage of oxygen between 1% and 10% by volume of the total gas in the vacuum vessel and produces an increase in the pressure in the vessel to a selected value of the order of $5 \times 10^{-2}$ mm Hg as measured on a Macleod vacuum pressure gauge 102.

The cathode 18 is supported at a selected distance of say 3 to 4 cm. from the glass substrate surface to be coated, and a selected negative voltage of between $-1.0$ KV and $-5$ KV is applied to the cathode. The poer applied to the heating element 20 is gradually reduced in order to maintain the glass substrate surface at the desired temperature, this step being necessary owing to the heating effect produced by ionic and electronic bombardment from the glow discharge between the cathode and substrate.

The ionised argon ions bombard the surface of the cathode 18 thus removing metal from the cathode and thereby reactively sputtering a film of oxide on to the upper surface of the glass substrate 17. At the completion of this process, the power supplies to the cathode 18 and the heating element 20 are disconnected, the gas flows turned off and the glass substrate allowed to cool.

The coated glass substrate is then removed from the vessel and the physical characteristics of the film may be determined by measurement and calculation.

The above method is applicable to the coating of a transparent and haze-free film on a glass substrate from a single, stationary cathode having a lateral dimension, e.g. a width or length, of 10 cm. or less. However, for substrates and cathodes of greater lateral dimensions, it has been found that the method results in the production of a non-uniform film which does not have the desired resistance in ohm/square and may not b haze-free, and the present inventors deduced that this effect is due to variation of the oxygen concentration in the atmosphere in the working space between the cathode and the subtrate surface. To investigate and measure this effect, there was employed a cathode measuring 45 cm. long by 15 cm. wide. A 60 cm. long by 30 cm. wide by 4 mm thick soda-lime-silica glass substrate was placed at a distance 38 mm from the cathode surface. The gaps formed between the edges of the cathode and the surface of the substrate were blanked off along the two long sides and one end by three pieces of glass. There was thus access for the sputtering atmosphere at one end only.

The vacuum vessel was evacuated to a pressure of $5 \times 10^{-4}$ mm Hg and a voltage of 10 volts was applied to the heater 20 to raise the temperature of the substrate surface to 300° C. A gas mixture consisting of 96% argon and 4% oxygen by volume, was admitted to the vaccum vessel thereby increasing the pressure in the vessel to $6.5 \times 10^{-2}$ mm Hg. The cathode was then energised to a voltage of $-3.0$ KV and sputtering was allowed to take place for a period of 10 minutes.

Upon removal of the glass substrate from the vessel it was immediately obvious that the characteristics of the film varied considerably from one end to the other. In particular, at the end where access of the sputtering atmosphere had been allowed the film was substantially transparent although slightly hazy. At the other end where access of the sputtering atmosphere had been restricted the film was completely opaque and metallic in appearance. Indeed the film showed characteristics over the 45 cm. length of the cathode which would be consistent with a considerable drop in the percentage of oxygen concentration.

Figure 2:
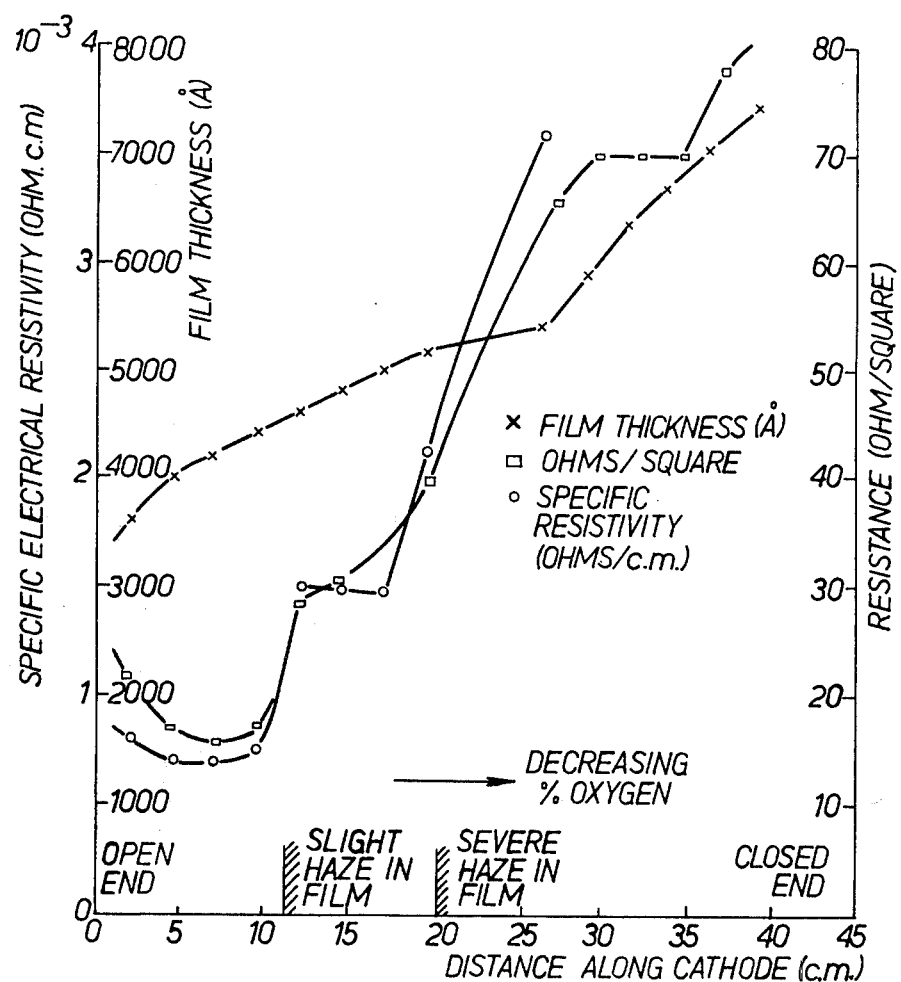
FIG. 2 is a graph of the resistance in ohm/square, thickness and specific electrical resistivity of a sputtered film as a function of the distance along the cathode in an experiment in which an oxygen concentration gradient is deliberately established along the cathode, starting with a known initial oxygen concentration.

The above experiment was repeated employing an atmosphere of 94% argon and 6% oxgyen, with a cathode voltage of $-2.75$ KV. As expected, it was found that the reduction in cathode voltage and increase in oxygen concentration reduced the degree of haze and shifted the specific resistivity curve to the right. At the end of the film where access of the sputtering atmosphere has been allowed, a highly transparent, haze-free film having a specific resistivity less than $10 \times 10^{-4}$ ohm. cm. was obtained. The film at the other end was very hazy and had a much higher resistivity. The results of this experiment are shown in FIG. 2 which comprises a graph of the resistance in ohm/square, the film thickness in Å and the specific resistivity ($\rho$) in ohm. cm. as a function of the distance along the cathode. This graph clearly shows that there is a percentage of oxygen concentration which results in a minimum specific resistivity.

Figure 3:
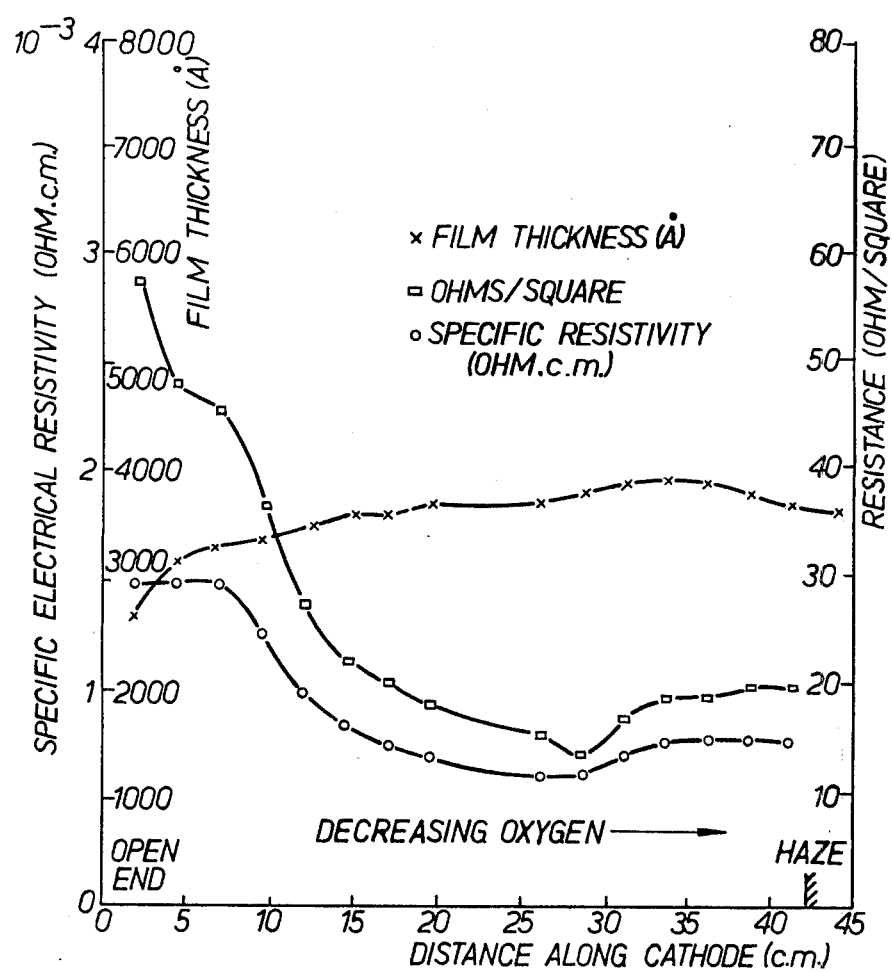
FIG. 3 is a similar graph to FIG. 2 in respect of a similar experiment but starting with a higher initial oxygen concentration.

The experiment was again repeated using th same reduced cathode voltages of $-2.75$ KV but with an increased oxygen concentration of 7% in the sputtering atmosphere. The results of this experiment are shown in FIG. 3 which is again a graph of the resistance in ohms/square, the film thickness in Å and the specific resistivity ($\rho$) in ohm. cm. as a function of the distance along the cathode. As before the graph shows that there is a percentage of oxygen concentration which results in a minimum specific resistivity.

These results indicated to the inventors that if the oxygen concentration in the sputtering atmosphere in the working space between the cathode and substrate could be controlled, it should be possible to maintain adequate uniformity of transparency, specific resistivity, thickness, and thus resistance in ohm/square of the sputtered film.

According to the invention, access is provided for the atmosphere to penetrate into the whole of the working space so as to maintain a substantial degree of uniformity of the oxygen concentration between the cathode and the substrate. Such access may be provided by a particular construction of the cathode and by the provision of relative motion between the cathode and the substrate surface. Some examples will now be described of suitable methods of controlling the uniformity of oxygen concentration over the area of the substrate surface.

Figures 4, 5:
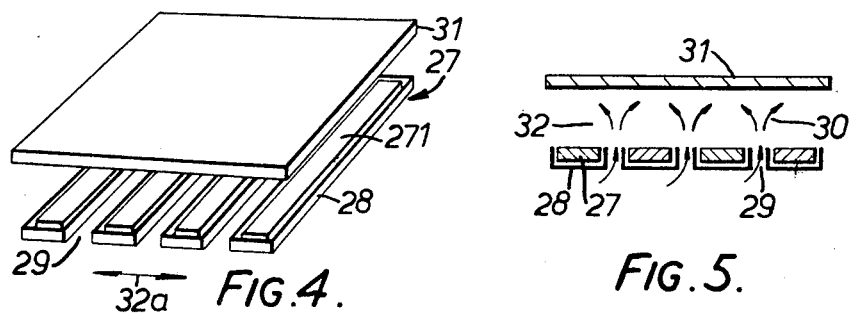
FIG. 4 is a schematic perspective view of a first form of modified cathode assembly for sputtering a large area substrate surface in accordance with the method of the present invention.
FIG. 5 is a schematic section through the cathode assembly of FIG. 4.

FIGS. 4 and 5 illustrate diagrammatically a first type of modified cathode assembly 27 for carrying out the method of the present invention. The cathode assembly 27 is divided into four parallel sections or strips 271, each strip measuring 60 cm. in length and 8 cm. in width and being surrounded by a separate earthed electrostatic shield 28. The cathode sections or strips 271 are spaced apart by gaps 29 of equal width. The individual gaps may be varied in width, for example between 1.0 cm. and 10 cm., and are provided to allow access for diffusion of the atmosphere from the under side of the cathode assembly 27 to the side adjacent to the substrate 31, as indicated by the arrows 30 in FIG. 5.

Means (not shown in FIGS. 4 and 5) are provided which effect relative motion between the substrate 31 and the cathode assembly 27 in a direction parallel to their facing surfaces. The preferred direction of relative motion is perpendicular to the length of the cathode strips 271. The motion is preferably an oscillatory motion of the cathode assembly 27 with a constant speed of traverse between reversing points, as shown by the double headed arrow 32a in FIG. 4, the amplitude of the oscillation being equal to the spacing between the centre lines of adjacent cathode strips 271. By this means, during sputtering the gradient of oxygen concentration in the atmosphere in the working space 32 between the cathode and substrate, which would result from the use of a single large area cathode, is reduced to an acceptable limit. As a consequence of the reduction in the oxygen gradient in the sputtering atmosphere, a substantially uniform conductive film of lower specific resistivity can be produced. The spacing between adjacent strips 271 is chosen to be the minimum which will provide adequate diffusion of the sputtering atmosphere into the working space 32, while maintaining a sufficient coating rate.

Figure 6:
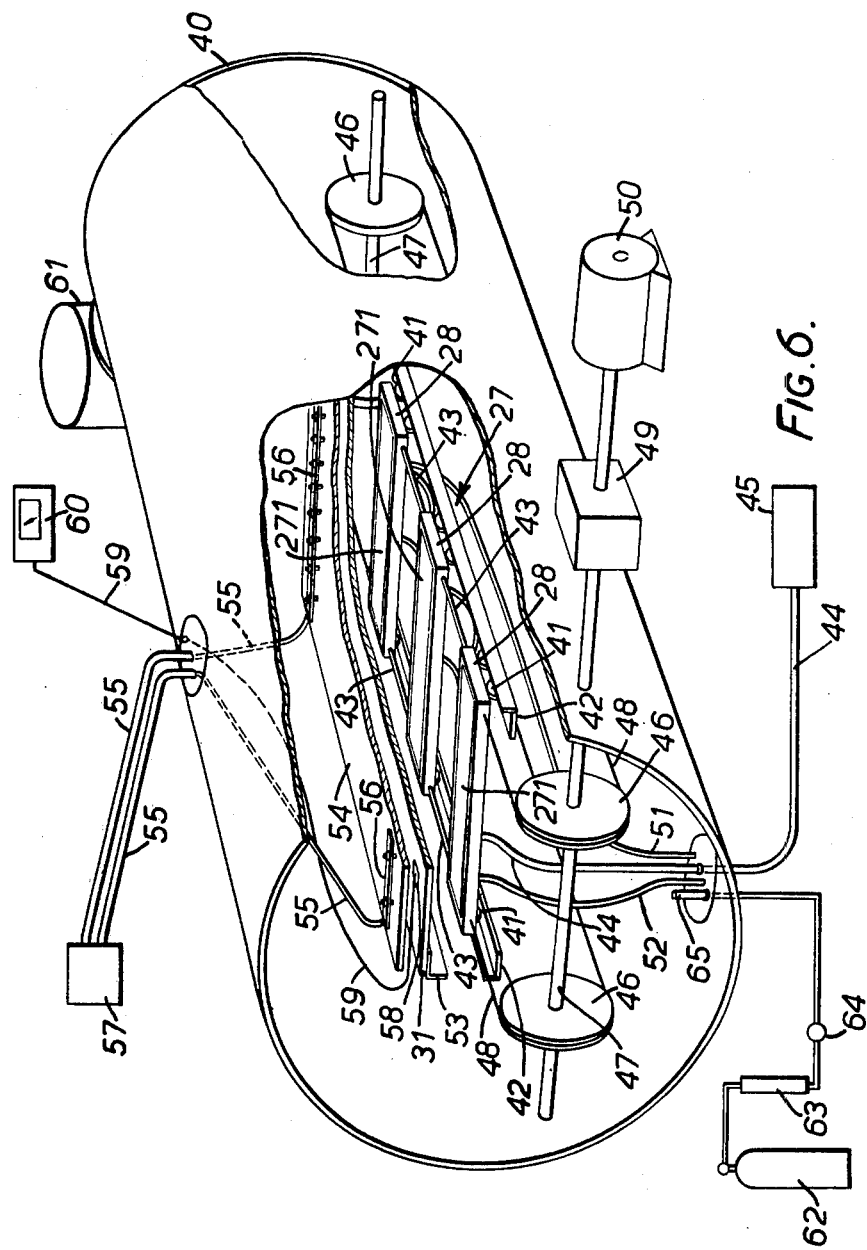
FIG. 6 is a perspective view of an apparatus according to the invention incorporating a cathode assembly as illustrated in FIGS. 4 and 5.

FIG. 6 illustrates an apparatus incorporating a cathode assembly of the kind described above with reference to FIGS. 4 and 5. The apparatus comprises a cylindrical vacuum vessel 40 with removable vacuum-tight end closures (not shown). The cathode assembly 27 comprises a plurality of spaced, parallel sections of strips 271 having upper surfaces of indium/tin alloy. Each strip 271 has an earthed electrostatic shield 28. Only three sections or strips 271 are shown in FIG. 6, for clarity. In practice, the number of strips used will depend on the length of the substrate to be coated, being generally chosen so that an oscillation having an amplitude equal to the spacing between the centre lines of the strips will cause all parts of the substrate to be covered. The strips 271 are mounted on pairs of rollers 41 at each of their ends, and these rollers run on horizontal guide rails 42 secured to opposite sides of the vessel 40. The strips 271 are connected to one another by adjustable link rods 43 which maintain their spacing and parallel alignment with one another and ensure that all the strips can move together along the guide rails in the direction perpendicular to their length. A flexible high-tension lead 44 connects the strips 271 to the negative terminal of a high-voltage source 45.

A pair of pulleys 46 is mounted on a transverse shaft 47 at each end of the vessel 40 and a pair of traction wires or cables 48 connected at each end to the electrostatic shields 28 of the end strips 271 are led over the pulleys 46 to form drive means. One of the shafts 47 passes through the wall of the vessel 40 and is connected via a variable-amplitude oscillatory motion device 49 to an electric motor 50.

Figure 7A:
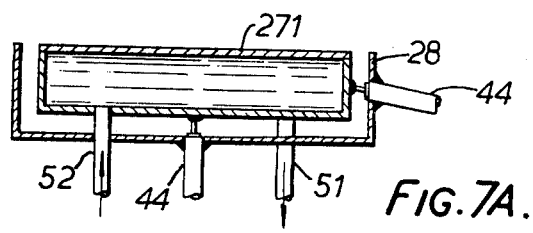
FIG. 7A is a detail sectional view to a larger scale, of one of the cathode sections used in the apparatus of FIG. 6 and FIG. 7.

Each of the strips 271 is hollow, as shown in FIG. 7A, its interior being filled with cooling water which is supplied through a flexible pipe 52 which enters near one end of the strip. The water leaves through a second flexible pipe 51 near the other end of the strip 271. The pipes 51, 52 connect the strips 271 in series, but the pipes extending between the adjacent strips have been omitted from FIGS. 6 and 7 for clarity. The high-tension lead 44 from source 45 is of the co-axial cable type, the outer conductor being earthed. Similar cables 44 connect the strips 271 to one another.

Above the horizontal guide rails 42, a pair of horizontal support rails 53 (only one of which is shown) are secured to opposite sides of the vessel 40 to support a substrate 31 which is to be provided with a transparent conducting film.

Above the position of the substrate 31, a radiant heater 54 is secured in the vessel 40, fed through low-tension leads 55 and busbars 56 from a low voltage power unit 57. The heater 54 extends over the whole area of the substrate 31.

A thermocouple 58 is placed on the upper surface of the substrate 31 and connected through leads 59 to a calibrated dial instrument 60 to indicate the temperature of the substrate.

A vacuum pump (not shown) is connected to the interior of the vessel 40 through an exhaust connection 61 and a gas supply 62 of the selected atmosphere is connected through a flow meter 63 and needle valve 64 to an inlet 65 opening into the vessel. The inlet 65 is at the opposite end of the vessel 40 from the exhaust connection 61 so that gas flow from inlet to exhaust tends to pass through the working space between the cathode assembly and substrate and thereby assists in maintaining uniformity of the oxygen concentration in the working space.

In use, when the substrate 31 has been placed on the support rails 53 and the end closures have been sealed, the vessel 40 is evacuated through the exhaust connection 61 and the selected sputtering atmosphere is supplied through the inlet 65, while the substrate is heated to the desired temperature by the heater 54. The cathode assembly 27 comprising the strips 271 is oscillated back and forth along the guide rails 42 by the motor 50 and the high negative voltage is supplied to the strips 271 by the source 45. The vessel 40 and rails 42, 53, as well as the electrostatic shields 28, are earthed. A film of indium/tin oxides is thus sputtered on to the lower surface of the subtrate 31. The heating effect on the substrate of the plasma in the working space is such that the heating current supply from the low voltage power unit has to be reduced to maintain the substrate temperature constant within ± 10° C. of the desired value. An automatic control circuit of known type (not shown) can be used for this purpose.

The amplitude of the oscillatory motion of the strips 271 is adjusted to equal the spacing between the centre lines of the strips. This spacing can be adjusted by means of the link rods 43. All parts of the substrate 31 are effectively covered for equal deposition times by the strips during one part or another of each oscillatory cycle.

The spaces between the strips 271 allow free circulation of the sputtering atmosphere so that no substantial oxygen gradient can become established. With an oxygen content of 3.0% by volume in the atmosphere supplied, it is believed that the reduction in the oxygen content in the working space is not more than 0.2%, i.e., a reduction from 3.0% to 2.8%. A substantially uniform highly transparent film of low specific resistivity can thus be deposited on the substrate. Variations in the specific resistivity can readily be kept within ± 10% of a mean value.

FIG. 7 illustrates a modification of the apparatus of FIG. 6 for use in depositing a film on to a substrate 311 which is longer than the substrate 31 shown in FIG. 6 and is curved from end to end, e.g. a windscreen for a motor vehicle. The support rails 531 and the guiderails 421 are similarly curved, as seen in elevation, and can be supported from the sides of the vacuum vessel 40 through separate brackets (not shown). The curvature of the guide rails 421 is such that the cathode sections or strips 271, shown here as being five in number, always remain parallel to the tangent to the adjacent portions of the substrate surface and at the required substantially constant distance from that surface, during their oscillatory movement. The heater 54 is formed in sections disposed on tangents to an arch which corresponds approximately to the curvature of the substrate 311. Other elements of the apparatus of FIG. 7 are similar to those of FIG. 6 and carry the same reference numerals.

Figure 8:
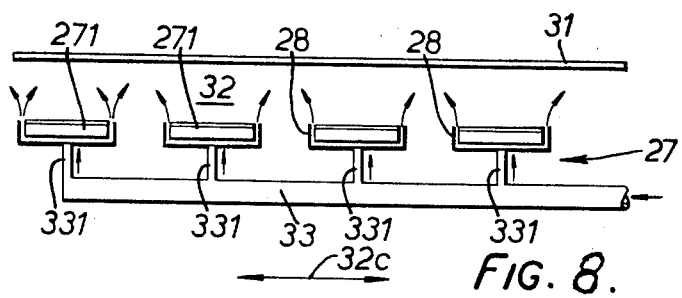
FIG. 8 is a schematic section through a fourth form of modified cathode assembly.

FIG. 8 illustrates a further embodiment of the invention. The cathode assembly 27 comprises spaced parallel sections or strips 271, each having a respective electrostatic shield 28 spaced from its under surface and sides, and a large-bore flexible gas supply pipe 33 has separate branches 331 leading to the interior of each shield 28. The other end of the pipe 33 passes through a vacuum seal in the wall of the vacuum vessel 40 to the source of the sputtering atmosphere, which is thus fed into the working space 32 through the spaces between each cathode section or strip 271 and its respective shield 28. Relative oscillatory motion between the cathode assembly 27 and the substrate 31 is again provided, as indicated by the arrow 32c, e.g. by means similar to those illustrated in FIGS. 6 and 7.

Figure 9:
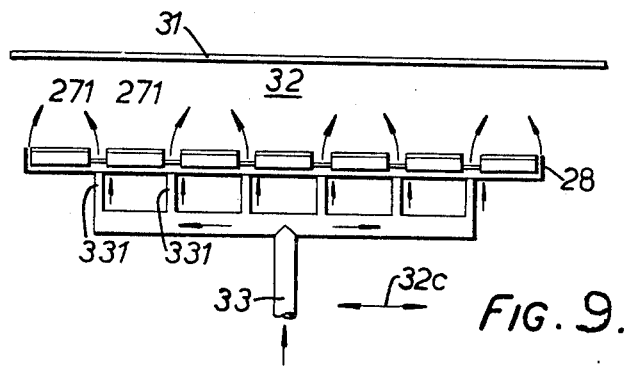
FIG. 9 is a similar view of a fifth form of modified cathode assembly.

FIG. 9 illustrates a modification of the cathode assembly of FIG. 8. In this embodiment, manufacture is simplified by use of a single common electrostatic shield 28 which surrounds all of the spaced parallel cathode sections or strips 271. Reduction of the number of components between which a high potential difference is applied also reduces the risk of electrical breakdown. The strips are spaced apart by a distance less than the dimension of the "dark space" which appears due to formation of a plasma on application of the high negative potential, so as to avoid side sputtering between adjacent cathode strips. The large-bore flexible gas supply pipe 33 leads as before into separate branch pipes 331 of smaller cross-section, which in this case open into the interior of the shield 28 at positions spaced over its area. The sputtering atmosphere diffuses into the working space through the gaps between adjacent cathode strips 271. Relative oscillatory motion is provided as in FIG. 8.

In each of these cases, gas supply through the different branch pipes 331 is equalised by using equal lengths of small-diameter branch pipes 331 from the main large-diameter gas supply pipe 33, or by using adjustable throttling devices in the branch pipes.

In each embodiment the cathode assembly may deposit a transparent electrically conducting film having a uniform specific electrical resistivity between $1 \times 10^{-4}$ ohm. cm. and $20 \times 10^{-4}$ ohm. cm. The film is desirably between 500 Å and 10,000 Å thick.

Figure 10:
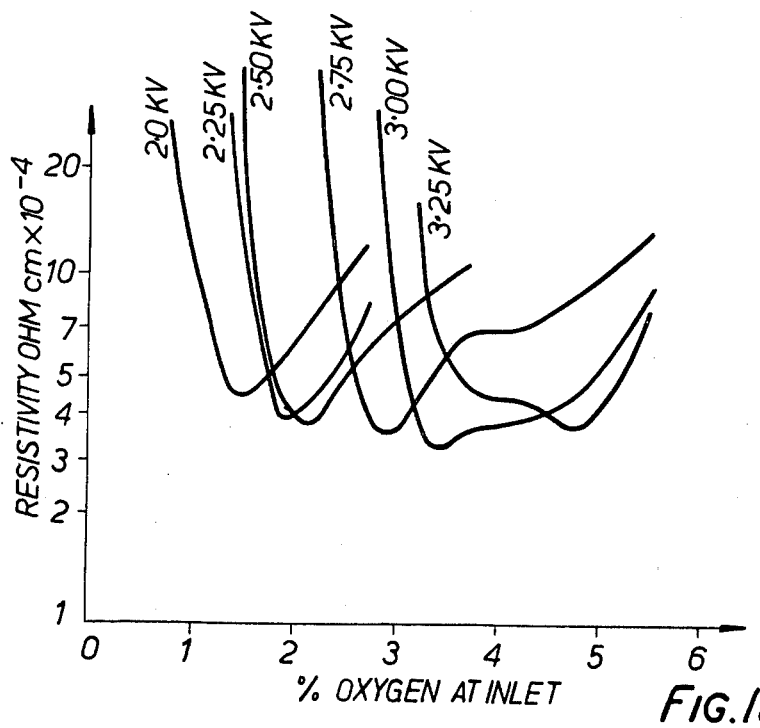
FIG. 10 is a graph of specific electrical resistivity against percentage oxygen concentration in the atmosphere of sputtering apparatus having one of the modified cathode assemblies of FIGS. 4 to 9, for a series of examples in which the oxygen concentration is maintained substantially uniform between the cathode or cathodes and a large area of substrate surface.

Some examples will now be described employing the apparatus of FIG. 6 or 7, in association with the graph of FIG. 10. In this graph there is shown the specific resistivity in ohm. cm. of the film deposited, plotted against the percentage oxygen in the sputtering atmosphere for different examples of cathode voltage. The graph of FIG. 10 is applicable to the coating of substrate surfaces of a size required for a vehicle windscreen, for example.

In each example, the cathode comprises 80% indium and 20% tin, by weight, the cathode is spaced 38 mm from the substrate surface and the substrate surface is heated to 300° C. The working pressure in the vacuum vessel in each case is $6.5 \times 10^{-2}$ mm Hg. Taking each graphical line in turn and starting from the left, the first line represents an example in which the cathode voltage is −2.0 KV. In this case the minimum specific resistivity of $4.5 \times 10^{-4}$ ohm. cm. is obtained with a uniform oxygen concentration of about 1.5% oxygen.

The second line corresponds to an increase in the cathode voltage to −2.25 KV. This results in the minimum resistivity of $3.8 \times 10^{-4}$ ohm. cm. being obtained with 1.9% oxygen present in the sputtering atmosphere.

The third line represents a cathode voltage of −2.5 KV, resulting in a still lower minimum specific resistivity of $3.7 \times 10^{-4}$ ohm. cm. with an increase of oxygen concentration to 2.2%. A minimum specific resistivity of $3.5 \times 10^{-4}$ ohm. cm. is achieved with an oxygen concentration of 2.9% in the case represented by the fourth line, in which the cathode voltage is increased to −2.75 KV. The fifth line, representing a cathode voltage of −3.0 KV, shows an even lower minimum specific resistivity of $3.2 \times 10^{-4}$ ohm. cm. achieved with an oxygen concentration of 3.4%.

With regard to the sixth line, the minimum value of specific resistivity of $3.7 \times 10^{-4}$ ohm. cm. is not so low and requires an increase in the oxygen concentration of the sputtering atmosphere to 4.8%. This sixth line represents a cathode voltage of −3.25 KV.

For the purposes of achieving an acceptable coating which is as stable as possible, the resistivity should be as low as possible. It will be seen from FIG. 10 that by increasing the voltage, the minima of resistivity are achieved with increasing oxygen concentrations. In practice, it has been found desirable to obtain a high rate of deposition by selecting an operating potential which is as high as the consequent practical problems (such as arcing) permit, and then to select the oxygen concentration, having fixed the other parameters at selected values, so as to obtain a low specific electrical resistivity. It is believed that coatings deposited under conditions corresponding to the minima of the curves shown in FIG. 10 are the most stable.

It will be appreciated that by appropriate choice of the conditions of cathode voltage and oxygen concentration in the atmosphere supplied to the vessel, so as to operate at or near the minimum of a curve such as is shown in FIG. 10, the specific resistivity of the sputtered film can be controlled to be below $4 \times 10^{-4}$ ohm. cm.

Further details of seven examples of glasses coated by use of the apparatus of FIG. 6 are given below:

EXAMPLE 1

(Aircraft Window)

A glass of dimensions 75 cm. × 60 cm. × 3 mm was mounted in a vacuum vessel 40 of length 330 cm. and circular diameter 120 cm. The glass was mounted opposite a cathode assembly 27 consisting of 4 parallel-sided cathode sections 271 of length 100 cm. and width 7.6 cm. The operative upper surfaces of the cathode sections were of an alloy of 87.5% indium, 12.5% tin. The spacing between the cathode sections and the substrate was 38 mm. The cathode sections 271 were spaced apart so as to give 78 cm. between their central axes and they were arranged for oscillation at constant speed between reversing points, through an amplitude of 18 cm.

The vacuum vessel was evacuated to a pressure of $8 \times 10^{-5}$ mm Hg and the glass was heated to a temperature of 330° C. Gas mixture containing 2.9% of oxygen and the remainder argon (apart from trace gases) was admitted to the system and a pressure of $5.6 \times 10^{-2}$ mm Hg established. The cathode assembly was then set into oscillatory motion at a frequency of about 1 cycle every 20 seconds and a negative voltage of 2.2 KV applied to the cathode. The voltage to the heater was continuously adjusted to maintain the substrate temperature constant within ± 10° C. Sputtering was maintained under these conditions for a period of 22 minutes, after which time the heater and cathode voltages were reduced to zero. The vacuum chamber was then opened to atmosphere and the coated glass removed. The glass had a coating which was uniform in thickness between the limits of 2450 Å and 2550 Å and had a resistance of 10 ohms/sq. The calculated specific resistivity of the coating was $2.5 \times 10^{-4}$ ohm. cm. The light transmission of the coated glass, which was substantially colourless, was found to be 85%.

EXAMPLE 2

(Aircraft Window)

The general features were as in Example 1 but the details were as follows:

| | |
|---|---|
| Glass dimensions: | 35 cm × 60 cm. × 4 mm. |
| Cathode assembly: | 5 cathode sections 7.6 cm. × 60 cm., spaced at 18 cm. between centre lines. |
| Amplitude of oscillation: | 18 cm. |
| Initial pressure on evacuation: | $10^{-4}$ mm Hg. |
| Temperature of glass: | 330° C. |
| Oxygen concentration: | 2.7% |
| Working pressure: | $6.3 \times 10^{-2}$ mm Hg. |
| Cathode voltage: | −2.4 KV. |
| Time of sputter: | 20 minutes. |
| Resistance of coated glass: | 10 ohms/sq. |
| Film thickness: | 1950 Å to 2050 Å |
| Specific resistivity: | $2.9 \times 10^{-4}$ ohm. cm. |
| Light transmission: | 82% |

EXAMPLE 3

(Locomotive Window)

| | |
|---|---|
| Glass dimensions: | 10 cm. × 55 cm. |
| Cathode assembly: | 5 cathode sections 7.6 cm. × 100 cm. spaced 23 cm. between centre lines. |
| Amplitude of oscillation: | 23 cm. |
| Initial pressure on evacuation: | $2 \times 10^{-4}$ mm Hg. |
| Glass temperature: | 350° C |
| Oxygen concentration: | 3.4% |
| Working pressure: | $5.6 \times 10^{-2}$ mm Hg. |
| Cathode voltage: | −2.7 KV |
| Time of sputter: | 6¾ minutes. |
| Resistance of coated glass: | 55 ohms/sq. |
| Film thickness: | 800 to 900 Å |
| Specific resistivity: | $4.7 \times 10^{-4}$ ohm. cm. |
| Light transmission: | 82% |

EXAMPLE 4

(Marine Window)

| | |
|---|---|
| Glass dimensions: | 55 cm. × 50 cm. |
| Cathode assembly: | 5 cathode sections 7.6 cm. × 100 cm. spaced 23 cm. between centre lines. |
| Amplitude of oscillation: | 23 cm. |
| Initial pressure on evacuation: | $2 \times 10^{-4}$ mm Hg. |
| Temperature of glass: | 350° C |
| Oxygen concentration: | 3.4% |
| Working pressure: | $5.6 \times 10^{-2}$ mm Hg. |
| Cathode voltage: | −2.65 KV |
| Time of sputter: | 20 minutes |
| Resistance of coated glass: | 10 ohms/sq. |
| Film thickness: | 2550 Å to 2650 Å |
| Specific resistivity: | $2.6 \times 10^{-4}$ ohm. cm. |
| Light transmission: | 84% |

EXAMPLE 5

(Marine Window)

| | |
|---|---|
| Glass dimensions: | 60 cm. × 105 cm. |
| Cathode assembly: | 5 cathode sections 7.6 cm. × 100 cm. spaced 23 cm. between centre lines. |
| Amplitude of oscillation: | 23 fcm. |
| Initial pressure on evacuation: | $2.5 \times 10^{-4}$ mm Hg. |
| Temperature of glass: | 350° C |
| Oxygen concentration: | 3.4% |
| Working pressure: | $5.2 \times 20^{-2}$ mm Hg. |
| Cathode voltage: | −2.7 KV |
| Time of sputter: | 20 minutes |
| Resistance of coated glass: | 12 ohms/sq. |
| Film thickness: | 2150 Å to 2250 Å |
| Specific resistivity: | $2.6 \times 10^{-4}$ ohm. cm. |
| Light transmission: | 82% |

EXAMPLE 6

(Aircraft window)

| | |
|---|---|
| Glass dimensions: | 35 cm. × 60 cm. × 4 mm. |
| Cathode assembly: | 5 cathode sections 7.6 cm. × 60 cm. spaced 18 cm. between centre lines. |
| Amplitude of oscillation: | 18 cm. |
| Initial pressure on evacuation: | $10^{-4}$ mm Hg. |
| Temperature of glass: | 330° C |
| Oxygen concentration: | 2.7% |
| Working pressure: | $6.0 \times 10^{-2}$ mm Hg. |
| Cathode voltage: | −2.4 KV |
| Time of sputter: | 24 minutes. |
| Resistance of coated glass: | 14.2 ohm/sq. |
| Film thickness: | 1800 Å to 2000 Å |
| Specific resistivity: | $2.8 \times 10^{-4}$ ohm. cm. |
| Light transmission: | 82% |

EXAMPLE 7

Aircraft Window)

| | |
|---|---|
| Glass dimensions: | 35 cm. × 60 cm. × 4 mm. |
| Cathode assembly: | 5 cathode sections 7.6 cm. × 60 cm. spaced 18 cm. between centre lines. |
| Amplitude of oscillation: | 18 cm. |
| Initial pressure on evacuation: | $10^{-4}$ mm Hg. |
| Temperature of glass: | 330° C |
| Oxygen concentration: | 2.7% |
| Working pressure: | $6.0 \times 10^{-2}$ mm Hg. |
| Cathode voltage: | −2.4 KV |
| Time of sputter: | 22 minutes |
| Resistance of coated glass: | 18.5 ohm/sq. |
| Film thickness: | 1600 Å to 1800 Å |
| Specific resistivity: | $3.0 \times 10^{-4}$ ohm. cm. |
| Light transmission: | 82% |

The uniformity of the resistance of the coated glasses of Examples 6 and 7 was measured by applying to the glass a grid pattern defining six columns of eleven squares each, and measuring the resistance for each square. The results are tabulated below.

EXAMPLE 6

| 16 | 14 | 15 | 14 | 14 | 15 |
|----|----|----|----|----|----|
| 16 | 15 | 15 | 14 | 13 | 14 |
| 16 | 16 | 15 | 13 | 14 | 15 |
| 15 | 15 | 15 | 15 | 15 | 16 |
| 14 | 14 | 14 | 14 | 14 | 14 |
| 14 | 13 | 14 | 14 | 13 | 14 |
| 14 | 13 | 13 | 13 | 13 | 13 |
| 16 | 15 | 14 | 15 | 14 | 14 |
| 14 | 14 | 13 | 13 | 14 | 14 |
| 15 | 15 | 15 | 16 | 15 | 15 |
| 19 | 18 | 17 | 18 | 16 | 19 |

EXAMPLE 7

| 20 | 19 | 18 | 18 | 18 | 18 |
|----|----|----|----|----|----|
| 20 | 19 | 18 | 18 | 18 | 18 |
| 19 | 18 | 18 | 17 | 17 | 19 |
| 20 | 20 | 20 | 20 | 20 | 20 |
| 19 | 18 | 18 | 18 | 18 | 19 |
| 19 | 18 | 17 | 17 | 17 | 18 |
| 18 | 17 | 17 | 17 | 17 | 18 |
| 18 | 18 | 17 | 17 | 17 | 17 |
| 18 | 19 | 18 | 17 | 16 | 18 |
| 20 | 19 | 18 | 19 | 18 | 18 |
| 23 | 21 | 20 | 20 | 20 | 20 |

It will be seen that, except for the edge effects which are usually found with coated films, the resistance is substantially uniform, within ± 10% of the mean figure.

Finally, there is given below a table of five examples of glasses 30 cm. square coated by the apparatus of FIG. 6.

All the sputtered films referred to in the table have a high light transmission which is in the range between 80% to 83%.

| Cathode composition | | Cathode | | d | $\mu \times 10^{-2}$ | Temp | Sputtering atmosphere | | t | ohm/ | $\rho$ |
|---|---|---|---|---|---|---|---|---|---|---|---|
| % Ir | % Sn | −KV | mA | mm | mm. Hg | °C | % Ar | % O$_2$ | (Å) | square | ohm. cm. |
| 80 | 20 | 2.5 | 105 | 30 | 7.5 | 270 | 97 | 3 | 2700 | 12 | $3.2 \times 10^{-4}$ |
| 80 | 20 | 2.5 | 100 | 30 | 7.5 | 270 | 96 | 4 | 2400 | 18 | $4.3 \times 10^{-4}$ |
| 80 | 20 | 3.0 | 80 | 30 | 6.0 | 270 | 95 | 5 | 2000 | 18 | $3.5 \times 10^{-4}$ |
| 80 | 20 | 3.75 | 25 | 30 | 5.0 | 300 | 94 | 6 | 1800 | 14.7 | $2.65 \times 10^{-4}$ |
| 88 | 12 | 4.0 | 45 | 38 | 6.5 | 300 | 97 | 3 | 3600 | 7.2 | $2.6 \times 10^{-4}$ | where d = distance between the cathode and the substrate surface
$\mu$ = working pressure in vacuum vessel
Temp = temperature of the substrate surface
t = thickness of sputtered film
ohm/square = resistance of film
$\rho$ = specific resistivity Other indium/tin alloys may be sputtered, and so may alloys of cadmium/indium, tin/antimony and antimony/tellurium, i.e. metals having an atomic number between 48 and 51, "doped" (i.e. alloyed) with an element of higher valency (preferably 1 or 2 higher) and similar atomic size. Alloys of indium/germanium, indium/phosphorus or indium/tellurium may also be used. Similarly the other parameters of the sputtering method described above may be varied, and the following ranges are given by way of example:

| | |
|---|---|
| Temperature of substrate surface | 240° C to 400° C |
| Potential applied to cathode | −1.0 KV to −5.0 KV |
| Working pressure of vacuum chamber | $1 \times 10^{-2}$ mm Hg to $10 \times 10^{-2}$ mm Hg |
| Distance between cathode and substrate | 20 mm to 100 mm |

Also, other oxygen-containing sputtering atmospheres may be employed. For example, the argon may be replaced by another gas inert to the other gases or materials in the vacuum vessel. Alternatively the atmosphere may contain a mixture of oxygen, argon and hydrogen, or oxygen, argon and carbon monoxide or carbon dioxide, the carbon monoxide or carbon dioxide being provided to supply a proportion of oxygen.

Furthermore, the invention may be applied to refractory or siliceous substrates other than glass, e.g. porcelain, silica or mica.

We claim:

1. Apparatus for depositing a transparent, electrically conducting, metal oxide film onto the surface of a substrate whose lateral dimensions exceed 30 cm., said apparatus comprising:
   (a) a vacuum chamber;
   (b) means for supporting the substrate in the vacuum chamber;
   (c) means for maintaining the substrate at a controlled elevated temperature in the vacuum chamber;
   (d) means for supplying a sputtering atmosphere of oxygen and another gas or gases at a controlled reduced pressure into the vacuum chamber;
   (e) a cathode assembly whose overall lateral dimensions are not substantially less than those of the substrate, said cathode assembly being arranged in the vacuum chamber in the vicinity of the substrate and presenting a plurality of elongated, side-by-side strips comprising a metal capable of being reactively sputtered, said strips being spaced apart to define passages therebetween for allowing the sputtering atmosphere to penetrate into the whole of the working space between the cathode assembly and the substrate;
   (f) means for applying a high negative potential to the cathode assembly so as to cause deposition of the metal oxide film on the substrate by reactive sputtering; and
   (g) means for causing relative translational movement between the cathode assembly and the substrate in a direction transverse to the length of said strips, through an amplitude substantially smaller than the overall length of the cathode assembly, but sufficient to cause all parts of the substrate to be coated by sputtering from at least one of said strips during the deposition process.

2. Apparatus according to claim 1, wherein the means for causing relative movement are arranged to cause a reciprocating movement of the strips.

3. Apparatus according to claim 1, wherein the means for causing relative movement are arranged to move the strips through a distance substantially equal to the spacing between the centre lines of adjacent strips.

4. Apparatus according to claim 1, wherein the strips each have a width in the range of 0.5 cm. to 20 cm.

5. Apparatus according to claim 4, wherein the strips each have a width in the range of 3 cm. to 10 cm.

6. Apparatus according to claim 1, wherein the strips are mounted on guide rails for movement parallel to the substrate and are connected to reciprocating drive means through traction wires running over pulleys at each end of the guide rails.

7. Apparatus according to claim 6, for depositing a film on a substrate which is curved along its length, wherein the guide rails are correspondingly curved to maintain the cathode strips at a substantially constant distance from the substrate surface during their reciprocating movement.

8. Apparatus according to claim 1, wherein an exhaust passage for connection to a vacuum pump is provided in the wall of the vacuum chamber, and the means for supplying the sputtering atmosphere comprise an inlet passage opening into the chamber at such a position that the atmosphere flow from inlet to exhaust tends to pass through the working space and thereby assists in maintaining uniformity of oxygen concentration in the working space.

9. Apparatus according to claim 1, wherein the means for maintaining the substrate at a controlled elevated temperature comprise a heater on the opposite side of the substrate support means from the cathode assembly.

10. Apparatus according to claim 1, wherein said elongated, side-by-side strips are parallel to each other.

11. Apparatus according to claim 1, wherein said strips extend parallel to the substrate surface.

12. Apparatus according to claim 1, wherein said means for applying a high negative potential are such that the negative potential is maintained between $-1$ and $-5KV$.

13. Apparatus according to claim 1, wherein said means for causing relative translational movement between the cathode assembly and the substrate is such that all parts of the substrate are coated for equal deposition periods.

14. Apparatus for depositing by reactive sputtering a stable, transparent, electrically conducting, metal oxide film onto the surface of a substrate whose lateral dimensions exceed 30 cm., said apparatus comprising:
(a) a vacuum chamber;
(b) means for supporting the substrate in said vacuum chamber;
(c) means for supplying a sputtering atmosphere of oxygen and another gas or gases;
(d) a cathode assembly whose overall lateral dimensions are not substantially less than those of the substrate, said cathode assembly being arranged in said vacuum chamber in the vicinity of the substrate and presenting a plurality of elongated, side-by-side strips comprising a metal capable of being reactively sputtered, said strips being spaced apart to define passages therebetween for allowing the sputtering atmosphere to penetrate into the whole of the working space between said cathode assembly and the substrate;
(e) means for heating the substrate to an elevated temperature selected in accordance with criteria to be recited prior to sputtering;
(f) means for applying a high negative potential to the cathode assembly to effect deposition of the metal oxide film by sputtering;
(g) means for controlling the oxygen concentration, the substrate temperature, the vacuum chamber pressure, and the cathode potential throughout the sputtering at values selected such that the deposition coating is haze-free and its specific electrical resistivity lies at or close to the minimum of the curve which is obtained by plotting specific electrical resistivity against oxygen concentration while maintaining the substrate temperature, vacuum chamber pressure, and cathode potential all constant at selected values; and
(h) means for causing relative translational movement between said cathode assembly and the substrate in a direction transverse to the length of said strips, through an amplitude substantially smaller than the overall length of said cathode assembly, but sufficient to cause all parts of the substrate to be coated by sputtering from at least one of said strips during the deposition process.

15. Apparatus according to claim 14, wherein the means for causing relative movement are arranged to cause a reciprocating movement of the strips.

16. Apparatus according to claim 14, wherein the means for causing relative movement are arranged to move the strips through a distance substantially equal to the spacing between the centre lines of adjacent strips.

17. Apparatus according to claim 14, wherein the strips each have a width in the range of 0.5 cm. to 20 cm.

18. Apparatus according to claim 17, wherein the strips each have a width in the range of 3 cm. to 10 cm.

19. Apparatus according to claim 14, wherein the strips are mounted on guide rails for movement parallel to the substrate and are connected to reciprocating drive means through traction wires running over pulleys at each end of the guide rails.

20. Apparatus according to claim 19, for depositing a film on a substrate which is curved along its length, wherein the guide rails are correspondingly curved to maintain the cathode strips at a substantially constant distance from the substrate surface during their reciprocating movement.

21. Apparatus according to claim 14, wherein an exhaust passage for connection to a vacuum pump is provided in the wall of the vacuum chamber, and the means for supplying the sputtering atmosphere comprise an inlet passage opening into the chamber at such a position that the atmospheric flow from inlet to exhaust tends to pass through the working space and thereby assists in maintaining uniformity of oxygen concentration in the working space.

22. Apparatus according to claim 14, wherein said elongated, side-by-side strips are parallel to each other.

23. Apparatus according to claim 14, wherein said strips extend parallel to the substrate surface.

24. Apparatus according to claim 14, wherein said means for causing relative translational movement between the cathode assembly and the substrate is such that all parts of the substrate are coated for equal deposition periods.

* * * * *